United States Patent
Lysen

(10) Patent No.: US 7,705,285 B2
(45) Date of Patent: Apr. 27, 2010

(54) PHOTODETECTOR ARRANGEMENT HAVING A SEMICONDUCTOR BODY WITH PLURAL LAYERS AND TRANSISTORS, MEASUREMENT ARRANGEMENT WITH A PHOTODETECTOR ARRANGEMENT AND PROCESS FOR OPERATING A MEASUREMENT ARRANGEMENT

(75) Inventor: Heinrich Lysen, Garching (DE)

(73) Assignee: Prueftechnik Dieter Busch AG, Ismaning (DE)

( * ) Notice: Subject to any disclaimer, the term of this patent is extended or adjusted under 35 U.S.C. 154(b) by 472 days.

(21) Appl. No.: 11/690,433

(22) Filed: Mar. 23, 2007

(65) Prior Publication Data
US 2007/0222016 A1 Sep. 27, 2007

(30) Foreign Application Priority Data
Mar. 23, 2006 (DE) .................. 10 2006 013 460

(51) Int. Cl.
*H01L 31/00* (2006.01)
(52) U.S. Cl. .................. 250/214.1; 250/214 R
(58) Field of Classification Search ............ 250/214 R, 250/207, 214 LA, 208.1, 214.1; 257/290–292, 257/443–459, 461; 345/179
See application file for complete search history.

(56) References Cited

U.S. PATENT DOCUMENTS

| | | | |
|---|---|---|---|
| 3,887,936 A * | 6/1975 | Shannon et al. ............... | 257/80 |
| 4,469,945 A | 9/1984 | Hoeberechts et al. | |
| 4,749,849 A | 6/1988 | Hoeberechts et al. | |
| 4,810,871 A | 3/1989 | Opheij | |
| 4,874,939 A | 10/1989 | Nishimoto et al. | |
| 4,887,140 A | 12/1989 | Wang | |
| 5,105,249 A | 4/1992 | Bierhoff et al. | |
| 5,324,929 A | 6/1994 | Yamada et al. | |
| 5,448,054 A | 9/1995 | Massey | |
| 6,593,636 B1 | 7/2003 | Bui et al. | |

(Continued)

FOREIGN PATENT DOCUMENTS

EP 0 206 363 A1 12/1986

(Continued)

OTHER PUBLICATIONS

Joe Wagner, Large Area PSD Series, http:www-cdr.stanford.edu/MADEFAST/catalogs/hamamatsu/psd-principle.html, Feb. 16, 2007, pp. 1-3.

(Continued)

*Primary Examiner*—Que T Le
(74) *Attorney, Agent, or Firm*—David S. Safran; Roberts Mlotkowski Safran & Cole, P.C.

(57) ABSTRACT

A photodetector arrangement has a semiconductor body formed of a substrate, a first layer at a first main surface of the semiconductor body, and a second layer at a second main surface of the semiconductor body. The second main surface is remote from the first main surface. A first and a second measurement terminal are arranged at the second main surface on the edge of the second layer in regions remote from one another and are formed for the electrical contact-connection of the second layer from outside the semiconductor body. A first and a second transistor couple the second layer to the first and respectively the second measurement terminal.

18 Claims, 5 Drawing Sheets

U.S. PATENT DOCUMENTS

| | | | |
|---|---|---|---|
| 6,815,790 | B2 | 11/2004 | Bui et al. |
| 2001/0001499 | A1 | 5/2001 | Takeshita et al. |
| 2007/0222017 | A1 | 9/2007 | Lysen |

FOREIGN PATENT DOCUMENTS

| | | |
|---|---|---|
| EP | 0 251 402 A2 | 1/1988 |
| EP | 0 400 753 A1 | 12/1990 |
| EP | 0 513 444 A1 | 11/1992 |
| EP | 1 113 504 A1 | 7/2001 |
| GB | 2 102 201 A | 1/1983 |
| JP | 4-10581 A | 1/1992 |
| JP | 10-12856 A | 1/1998 |
| JP | 10-290013 A | 10/1998 |
| WO | 84/04960 A1 | 12/1984 |

OTHER PUBLICATIONS

Y. Morikawa et al., A Small-Distortion Two-Dimensional Position-Sensitive Detector (PSD) With On-Chip MOSFET Switches; Sensors and Actuators A, Elsevier Sequoai S.A., Lausanne, CH; vol. A34, No. 2, Aug. 1, 1992; pp. 123-129; XP000297724; ISSN: 0924-4247.

Hanns-Peter Siebert, Optoelektronische Positionsdetektoren PSD: Völlig Aufgelöst; Elektronik, Weka Fachzeitschriftenverlag, Poing, DE; vol. 13, Jun. 29, 1984; pp. 84-88; XP002032544; ISSN: 0013-5658.

European Search Report for European Application No. 07 00 3347 Dated May 2, 2008.

European Search Report for European Application No. 07 003348 Dated May 8, 2008.

\* cited by examiner

PHOTODETECTOR ARRANGEMENT HAVING A SEMICONDUCTOR BODY WITH PLURAL LAYERS AND TRANSISTORS, MEASUREMENT ARRANGEMENT WITH A PHOTODETECTOR ARRANGEMENT AND PROCESS FOR OPERATING A MEASUREMENT ARRANGEMENT

BACKGROUND OF THE INVENTION

1. Field of the Invention

This invention relates to a photodetector arrangement, a measurement arrangement with a photodetector arrangement and a process for operating a measurement arrangement.

2. Description of Related Art

Photodetector arrangements are used, for example, to determine the position of the incidence site of a light beam. PN diodes and PIN diodes are used for this purpose. Examples of known position sensitive photodetector arrangements can be found in U.S. Pat. Nos. 6,815,790; 4,887,140; and 4,874,939 as well as in International Patent Application Publication WO 84/04960.

SUMMARY OF THE INVENTION

In one embodiment, a photodetector arrangement comprises a semiconductor body, having a substrate; a first layer at a first main surface of the semiconductor body which is suited for reception of the incident photon radiation which is to be detected; a second layer at the second main surface of the semiconductor body which is away from the first main surface; first and second measurement terminals which are located on the second main surface on the second layer on edge sides in regions which are away from one another and are made to make electrical contact with the second layer from outside the semiconductor body, and first and second transistors for electrical coupling of the second layer to the first and second measurement terminal respectively.

A process for operating a measurement arrangement with a photodetector arrangement in accordance with the invention comprises irradiation of the photodetector arrangement with photon radiation; producing electron hole pairs in a semiconductor body of the photodetector arrangement as a result of photon radiation; switching of a first and second transistor which couple the second layer at the second main surface of the semiconductor body to a first and second measurement terminal, in the first operating state in conduction, and determining the first and second measurement current; and switching the first and the second transistor into a blocking state in a second operating state.

The invention is explained in further detail below with reference to the accompanying drawings.

DETAILED DESCRIPTION OF THE INVENTION

Layers, arrangements and components of the same function and action bear the same reference numbers. To the extent layers, arrangements or components correspond in their operation, their description is not repeated with respect to each of the figures.

Figure 1A:
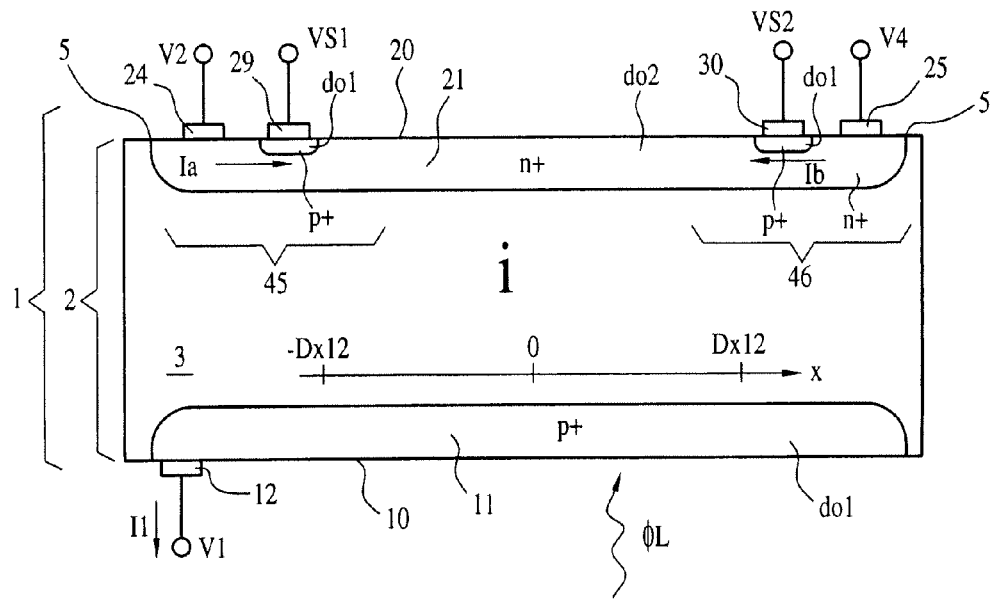
FIGS. 1A & 1B are cross-sectional views of embodiments of a photodetector arrangement according to the invention.

FIG. 1A shows an embodiment of a photodetector arrangement 1 according to the suggested principle of the invention. The photodetector arrangement 1 has a semiconductor body 2 with a substrate 3, a first layer 11 and a second layer 21. The first layer 11 is located at the first main surface 10 and the second layer 21 is located on the second main surface 20 of the semiconductor body 2. The first main surface 10 is at a distance from the second main surface 20. The total current terminal 12 is coupled to the first layer 11. First and second measurement terminals 24, 25 are coupled to the second layer 21 and are arranged at a distance from one another on the peripheral edge 5 of the second layer 21. The first layer 11 has a first conduction type do1 and is heavily P-doped. The second layer 21 has the second conduction type do2 and is heavily N-doped. The second layer 21 preferably has a sheet resistance between 1 and 9 kOhm per square. Two regions which have the first conduction type do1 and which are highly p doped are implemented in the second layer 21 and are connected to a first and a second control terminal 29, 30 of a first and a second transistor 45, 46. This connection is made electrically conductive. The first and the second transistor 45, 46 couple the second layer 21 to the first and second measurement terminal 24, 25, and are each realized as a junction field effect transistor. The semiconductor body 2 is made of silicon. The substrate 3 is made of an intrinsically conducting semiconductor body.

There is a first potential V1 at the total current terminal 12. At the first measurement terminal 24, a second potential V2 and on the second measurement terminal 25, a fourth potential V4 can be tapped. The first potential V1 is smaller than the second and the fourth potential V2, V4. Thus, the substrate 3 is made as a space charge zone. The first and the second control terminals 29, 30 are supplied with the first and second control voltages VS1, VS2. If the first control voltage VS1 is virtually at the value of the second potential V2 and the second control voltage VS2 is virtually at the value of the fourth potential V4, the first and the second transistors 45, 46 are conductive. The electron hole pair produced by the photon radiation ΦL in the substrate 3 thus contributes to a detector current I1 which is dissipated via the total current terminal 12. The detector current I1 is divided into a first measurement current Ia, which flows via the first transistor 45 to the first measurement terminal 24, and into a second measurement current Ib which flows via the second transistor 46 to the second measurement terminal 25. If the first control potential VS1 in the second operating state is at a significantly lower value than the second potential V2, and accordingly, the second control potential VS2 is at a significantly lower value than the fourth potential V4, the first and the second transistors 45, 46 are turned off. Advantageously, a current path to the two measurement terminals 24, 25 can alternately be switched to be conductive or blocking by means of the two transistors 45, 46.

Figure 1B:
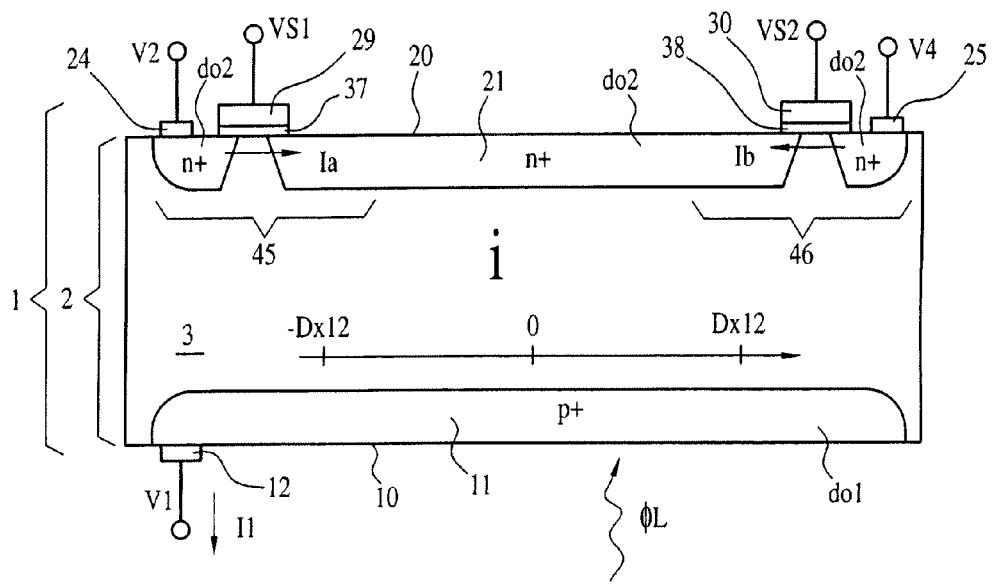

FIG. 1B shows another embodiment of a photodetector arrangement according to the principle of the invention. In contrast to the photodetector arrangement 1 as shown in FIG. 1A, in the photodetector arrangement 1 as shown in FIG. 1B, the first and the second transistors 45, 46 are made as MOSFETs. The first and the second control terminals 29, 30 are coupled via first and second gate insulators 37, 38 to the semiconductor body 2. The source regions of the two transistors 45, 46 are connected to the first and the second measurement terminals 24, 25, are located in the semiconductor body 2, and are doped with the second conduction type do2, like the second layer 21.

In a first operating state, the first and the second control potentials VS1, VS2 are set to values higher than a threshold voltage so that an inversion layer of electrons is formed at the boundary of the first and second gate insulators 37, 38 relative to the semiconductor body 2. Thus, first and second measurement currents Ia, Ib can flow from the second layer 21, via the respective inversion layer, to the first and second measurement terminals 24, 25. In a second operating state, if the first and the second control potentials VS1, VS2 are set to a value smaller than the threshold voltage, no current flows from the second layer 21 to the first and second measurement terminals 24, 25. Advantageously, the two transistors 45, 46 can be switched in alternation to be conductive or blocking by the two control potentials VS1, VS2.

As an alternative, in the photodetector arrangements 1 shown in FIGS. 1A & 1B, layers having the first conduction type do1 can be n-doped and the layers with the second conduction type do2 can be p-doped.

Figure 2A:
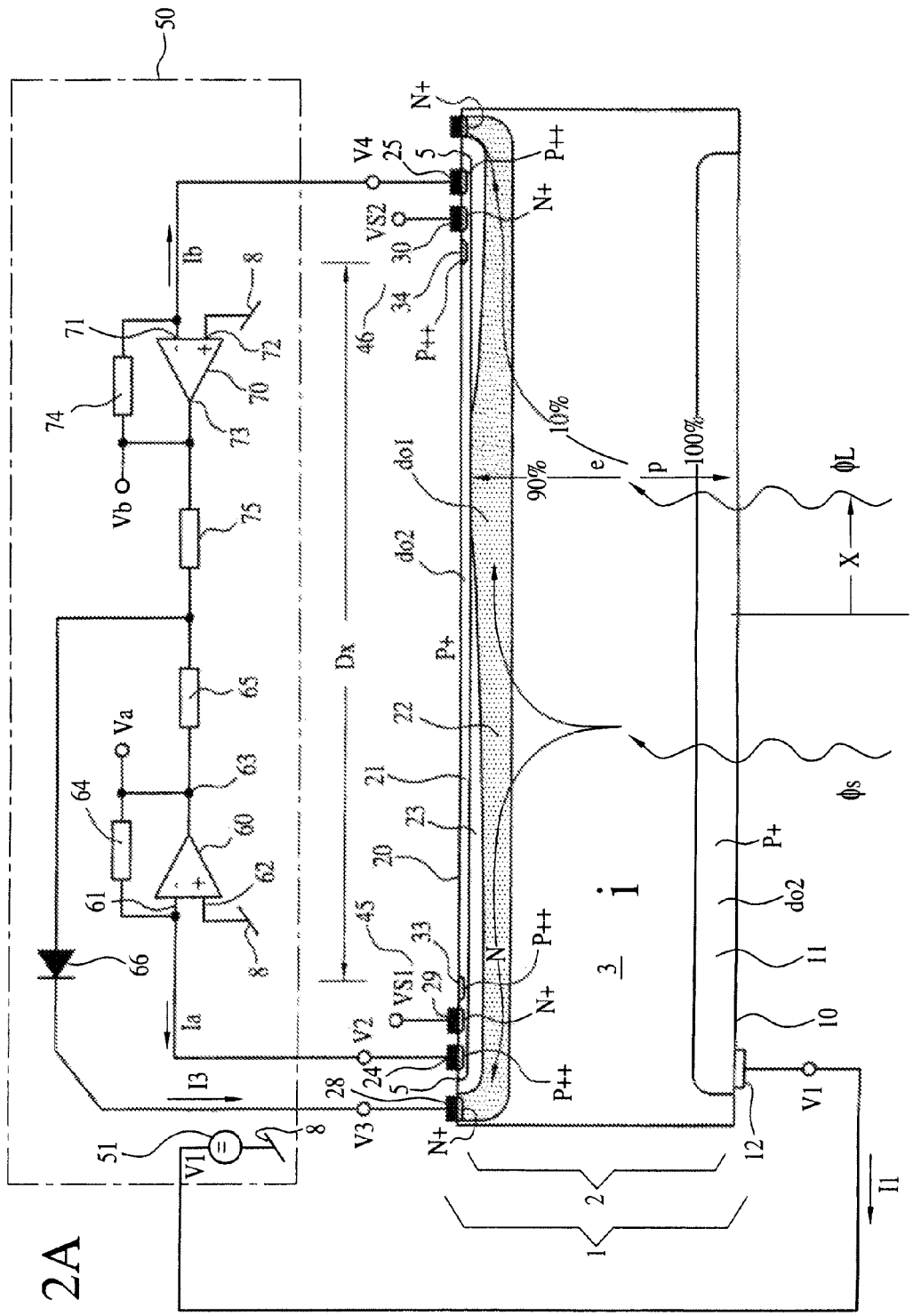
FIGS. 2A to 2E show alternative sample embodiments of a photodetector arrangement with a circuit arrangement according to the invention in sectional views in FIGS. 2A, 2C-2E with FIG. 2B being a top plan view of FIG. 2A.

FIG. 2A shows an embodiment of a photodetector arrangement 1 using the photodetector arrangements 1 as shown in FIGS. 1A & 1B, and a circuit arrangement 50. In contrast to the arrangements as shown in FIGS. 1A & 1B, the semiconductor 2 as shown in FIG. 2A comprises a third layer 22 which is provided between the second layer 21 and the substrate 3 and is connected to the second main surface 20 on the edges of the illustrated semiconductor 2. On the third layer 22, there is a compensation terminal 28. The first transistor 45 comprises a first control terminal 29 and a first drain region 33. Accordingly, the second transistor 46 comprises a second control terminal 30 and a second drain region 34. The first and second layers 11, 21 have the second type of conduction do2 and are made as P or alternatively as highly P doped layers. The third layer 22 has the first conduction type do1 and is made as an N-doped layer.

The circuit arrangement 50 has a voltage source 51 which is connected to the total current terminal 12. Furthermore, the circuit arrangement 50 comprises a first amplifier 60 which is connected at a first input 61 to the first measurement terminal 24 and via a first feedback impedance 64 to an output 63 of the amplifier 60. Accordingly, the circuit arrangement 50 has a second amplifier 70 which is connected at the first terminal 71 to the second measurement terminal 25 and via a second feedback impedance 74 to an output 73 of the amplifier 70. A second input 62 of the first amplifier 60 and a second input 72 of the second amplifier 70 are connected to the reference potential terminal 8. The first input 61 is inverting relative to the second input 62 of the first amplifier 60, and the first input 71 of the second amplifier 70 is switched to be inverting relative to the second input 72. The output 63 of the first amplifier 60 and the output 73 of the second amplifier 70 are connected, via first and second impedances 65, 75, to a node which is coupled by means of a diode 66 to the compensation terminal 28.

The first layer 11 is contact-connected with the total current terminal 12, the second layer 21 is contact-connected with the first and second measurement terminal 24, 25, and the third layer 22 is contact-connected the compensation terminal 28. A first potential V1 is provided at the total current terminal 12, a second potential V2 at the first measurement terminal 24, a fourth potential V4 at the second measurement terminal 25, and a third potential V3 is provided at the compensation terminal 28. The second potential V2 is set to be smaller than the third potential V3, so that the first space charge zone 23 is formed between the second and third layers 21, 22. The first potential V1 is smaller than the third potential V3 so that the substrate 3 between the first layer 11 and the third layer 22 is likewise formed as a space charge zone. Light radiation φL which is incident on the photodetector arrangement 1 is absorbed within the semiconductor body 2 and produces electron hole pairs. Electrons e and holes p which are generated in the substrate 3 between the first layer 11 and the third layer 22 contribute to a detector current I1 which flows through the total current terminal 12. The value of the detector current I1 corresponds to the total of the values of the first measurement current Ia which flows through the first measurement terminal 24, of the second measurement current Ib which flows through the second measurement terminal 25, and of a compensation current I3 which flows through the compensation terminal 24. The voltage source 51 makes available the first potential V1. The first and the second amplifier 60, 70 are used to convert the first and second measurement currents Ia, Ib into first and second output voltages Va, Vb which are provided at the outputs 63, 73 of the two amplifiers 60, 70.

If the light beam φL is incident on the photodetector arrangement 1 nearer the first measurement terminal 24 than the second measurement terminal 25, the first measurement current Ia has a higher value than the second measurement current Ib. The x-coordinates of the position of the incidence site of the light beam φL on the photodetector arrangement 1 can be determined roughly with the following equation:

$$x = \frac{Dx}{2} \frac{Ia - Ib}{Ia + Ib} = \frac{Dx}{2} \frac{Va - Vb}{Va + Vb},$$

Ia and Ib being the first and the second measurement currents, respectively, Va and Vb being the first and second output voltages, respectively, and Dx being the distance between the first and second drain regions 33, 34. Stray radiation φs can produce electron hole pairs. For example, stray radiation φs with a power of 0.01 mW is shown which corresponds to a current on the order of 1 µA in the third layer 22. A light beam φL with an energy of, for example, 0.1 mW and a wavelength of, for example, 635 nm is likewise incident on the photodetector arrangement 1 and produces electron hole pairs.

The ratio of the compensation current I3 to the sum of the first and second measurement currents Ia, Ib is set such that the compensation current I3 corresponds to the portion produced by the stray radiation φs in the detector current I1. The first and second feedback impedances 64, 74 and the first and second impedances 65, 75 can be resistors. The two feedback impedances 64, 74 can, for example, have a resistance value of 30 kOhm and the two impedances 65, 75 can have a resistance value of 300 kOhm so that the compensation current I3 is, for example, 10% of the value of the sum of the first and second measurement currents Ia, Ib. Thus, the detector current portion produced by the stray radiation φs drains via the compensation terminal 28. For this purpose, the compensation current I3 from the output 63 of the first amplifier 60 flows via the first impedance 65 and from the output 73 of the second amplifier 70 via the second impedance 75 to the diode 66, and thus, to the compensation terminal 28. The third layer 22 is doped lower than the second layer 21 so that the main portion of the detector current I1 flows through the third layer 22 to the second layer 21. The third layer 22 preferably has a sheet resistance between 10 and 100 kOhm per square.

The first and second control terminals 29, 30 are supplied with the first and the second control potentials VS1, VS2. If the first and second transistors 45, 46 are switched into an off state by means of the first and second control potentials VS1, VS2, then the first and second measurement currents Ia, Ib do not flow. However, if the first and second transistors 45, 46 are switched on by means of the first and second control potentials VS1, VS2, advantageously, the x-coordinate of the position of the incidence site of the light beam φL can be determined from the level of the first and second measurement currents Ia, Ib. Advantageously, the effect of the stray radiation φs can be reduced by means of the compensation current I3.

Alternatively, the first and the second drain region 33, 34 can be omitted.

In one alternative embodiment, the first layer 11 and the second layer 21 are made as N doped layers and the third layer 22 is made as a P doped region.

Figure 2B:
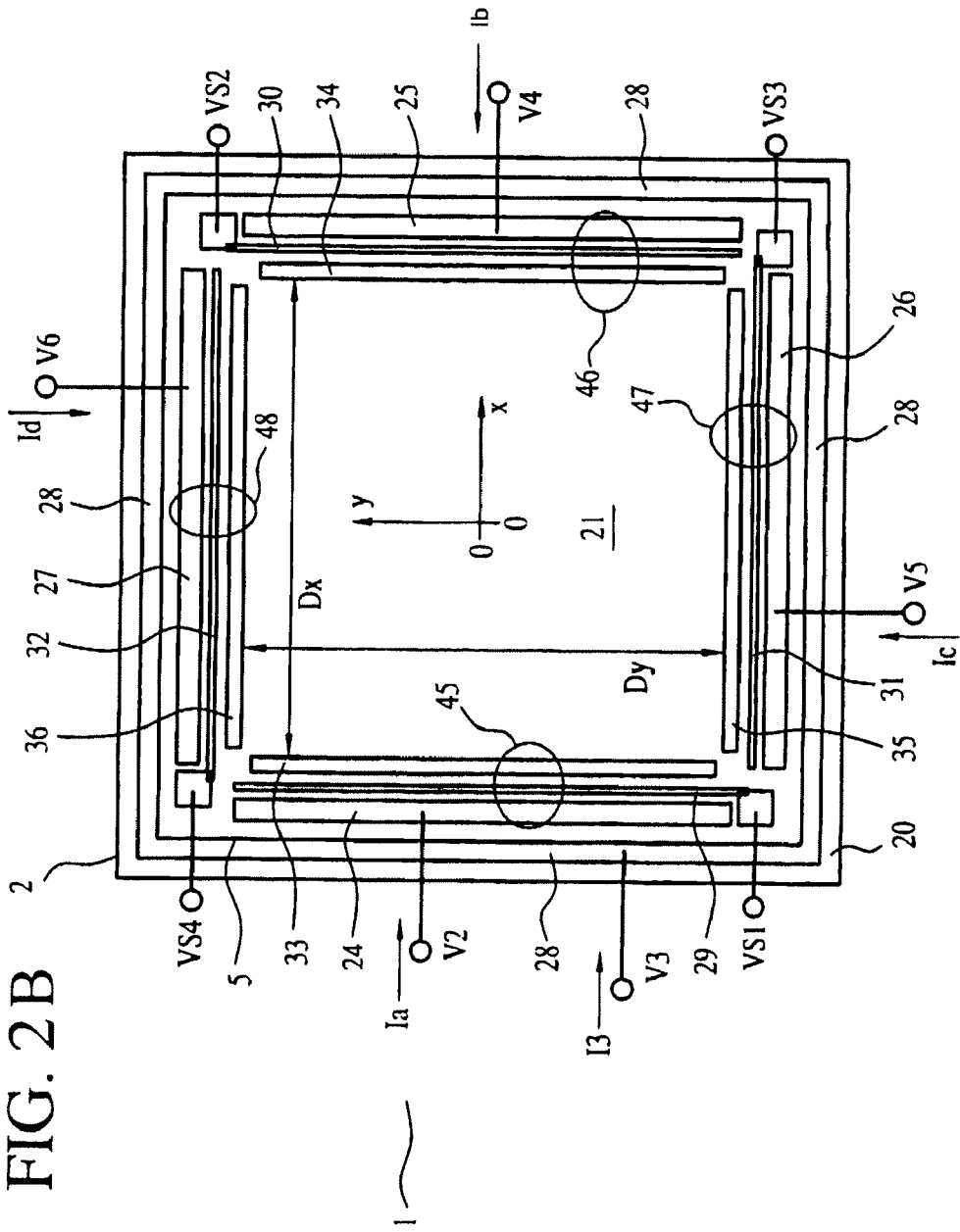

FIG. 2B shows an embodiment of the photodetector arrangement 1 as shown in FIG. 2a in a top view of the second main surface 20. The second main surface 20 has a second layer 21 which can be rectangular, especially square. The first measurement terminal 24 is made as a strip along the edge 5 of the second layer 21. Accordingly, also a second, a third and a fourth measurement terminal 25, 26, 27 are each provided as strips on a respective edge 5 of the second layer 21. The four measurement terminals 24 to 27 are located on the edges of a rectangle. The first and the second measurement terminals 24, 25 are located remote from one another, as are the third and the fourth measurement terminals 26, 27. An imaginary connecting line from the first measurement terminal 24 to the second measurement terminal 25 crosses an imaginary connecting line from the third measurement terminal 26 to the fourth measurement terminal 27.

Electrical contact is made with the four measurement terminals 24 to 27 from the outside so that second, fourth, fifth and sixth potentials V2, V4, V5, V6 can be tapped at it. Around the second layer 21 and thus around the four measurement terminals 24 to 27, there is a compensation terminal 28 in a strip shape with which electrical contact is made from the outside for supplying a third potential V3. The photodetector arrangement 1 has four transistors 45 to 48. The first transistor 45 comprises the first control terminal 29 and the first drain region 33 and couples the second layer 21 to the first measurement terminal 24. The second, the third and the fourth transistors 46, 47, 48 are formed correspondingly.

If the first and second transistors 45, 46 are switched in conduction and the third and the fourth transistors 47, 48 are switched off, the x-coordinate of the position of the incidence of the light beam φL can be determined by means of the first and second measurement current Ia, Ib. The y-coordinate can be determined from the value of the third measurement current Ic and the value of the fourth measurement current Id as soon as the first and second transistors 45, 46 are switched off and the third and fourth transistors 47, 48 are switched on.

Alternatively, the four drain regions 33 to 36 can be omitted, or the four drain regions 33 to 36 can be conductively connected to one another in the semiconductor body 2 such that they are formed as a strip.

In an alternative embodiment, the photodetector arrangement 1 has second, third and fourth compensation terminals which are coupled to the third layer 22 and are arranged on the edge side at the photodetector arrangement 1 in regions remote from one another.

Figure 2C:
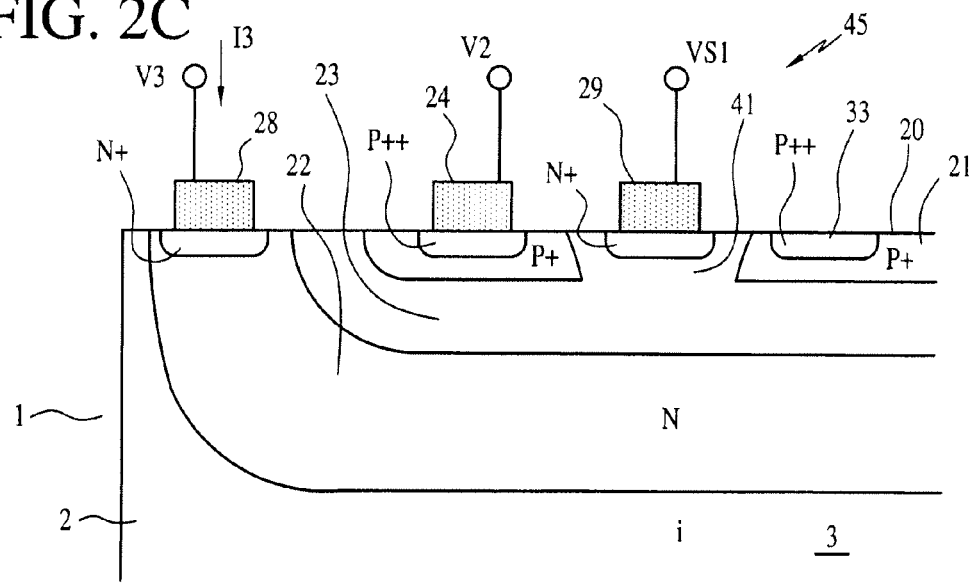

FIG. 2C shows an extract from the photodetector arrangement 1 as shown in FIG. 2A. The first transistor 45 couples the first measurement terminal 24 to the second layer 21. To do this, in the semiconductor body 2 under the first measurement terminal 24, there is a very heavily P-doped region which passes into a highly P doped region so that the first measurement terminal 24 has ohmic contact with the semiconductor body 2. In the second layer 21, on the edge side, there is a first drain region 33 which is heavily P-doped. Under the first control terminal 29 in the semiconductor body 2, there is a heavily N-doped region. The compensation terminal 28 is coupled via a heavily N-doped region to the N-doped third layer 22. If the first control potential VS1 is at a higher potential than the second potential V2, the semiconductor body 2 in the region 41 below the first control terminal 29 is made as a space charge zone and the first transistor 45 is switched off.

Figure 2D:
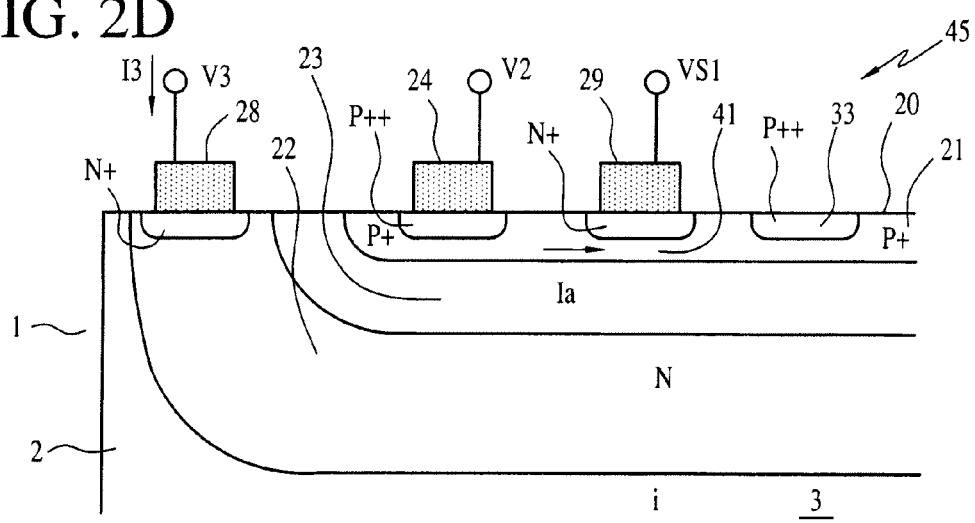

FIG. 2D shows the same extract of the photodetector arrangement 1 as FIG. 2C. In contrast to FIG. 2C, in FIG. 2D, the first control potential VS1 is roughly at the same value as the second potential V2. Thus, a space charge zone is not formed under the first control terminal 29 in the region 41. The first transistor 45 is switched to be conducting and a current path for the first measurement current Ia from the first drain region 33 to the first measurement terminal 24 is conductive.

Figure 2E:
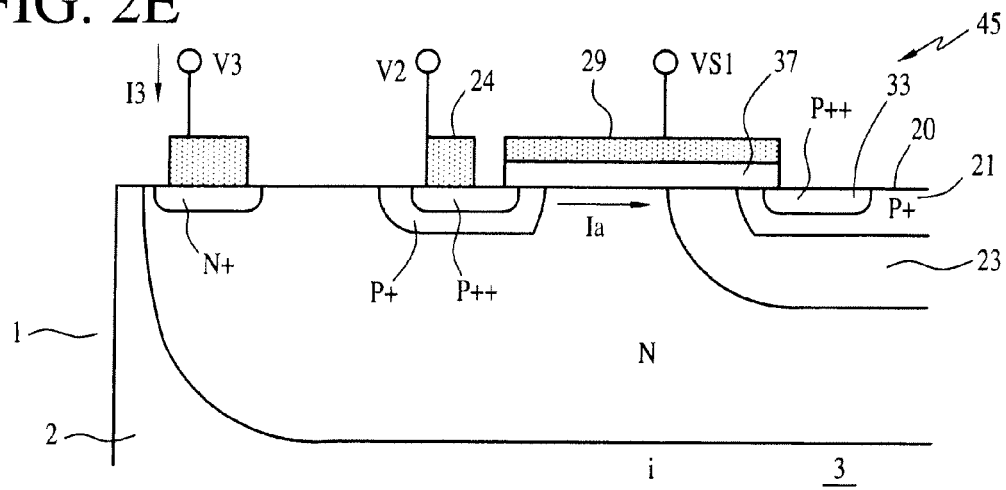

FIG. 2E shows the same extract of the photodetector arrangement 1 as FIGS. 2C & 2D. In contrast to FIGS. 2C & 2D, in the photodetector arrangement 1 as shown in FIG. 2E, the first transistor 45 is made as a MOSFET which comprises the first gate insulator 37 between the first control terminal 29 and the semiconductor body 2. A first drain region 33 which is strongly P-doped is realized at the edge of the second layer 21. The semiconductor body under the first gate insulator 37, and thus between the region under the first measurement terminal 24 and the drain region 33, has a N-doped region. If the first control potential VS1 is at a smaller value than the threshold voltage, an inversion layer of holes in the semiconductor body 2 under the gate insulator 37 is formed. Via this inversion layer, the first measurement current Ia can flow from the second layer 21 via the first drain region 33 to the first measurement terminal 24. If the first control potential VS2 has a value above the threshold voltage, then no inversion layer occurs and a first measurement current Ia cannot be tapped at the first measurement terminal 24. The second, third and fourth transistor 46, 47, 48 can be made in a manner corresponding to the first transistor 45.

Alternatively, there is no first drain region 33 and the second layer 21 extends to below the first gate insulator 37.

Figure 3:
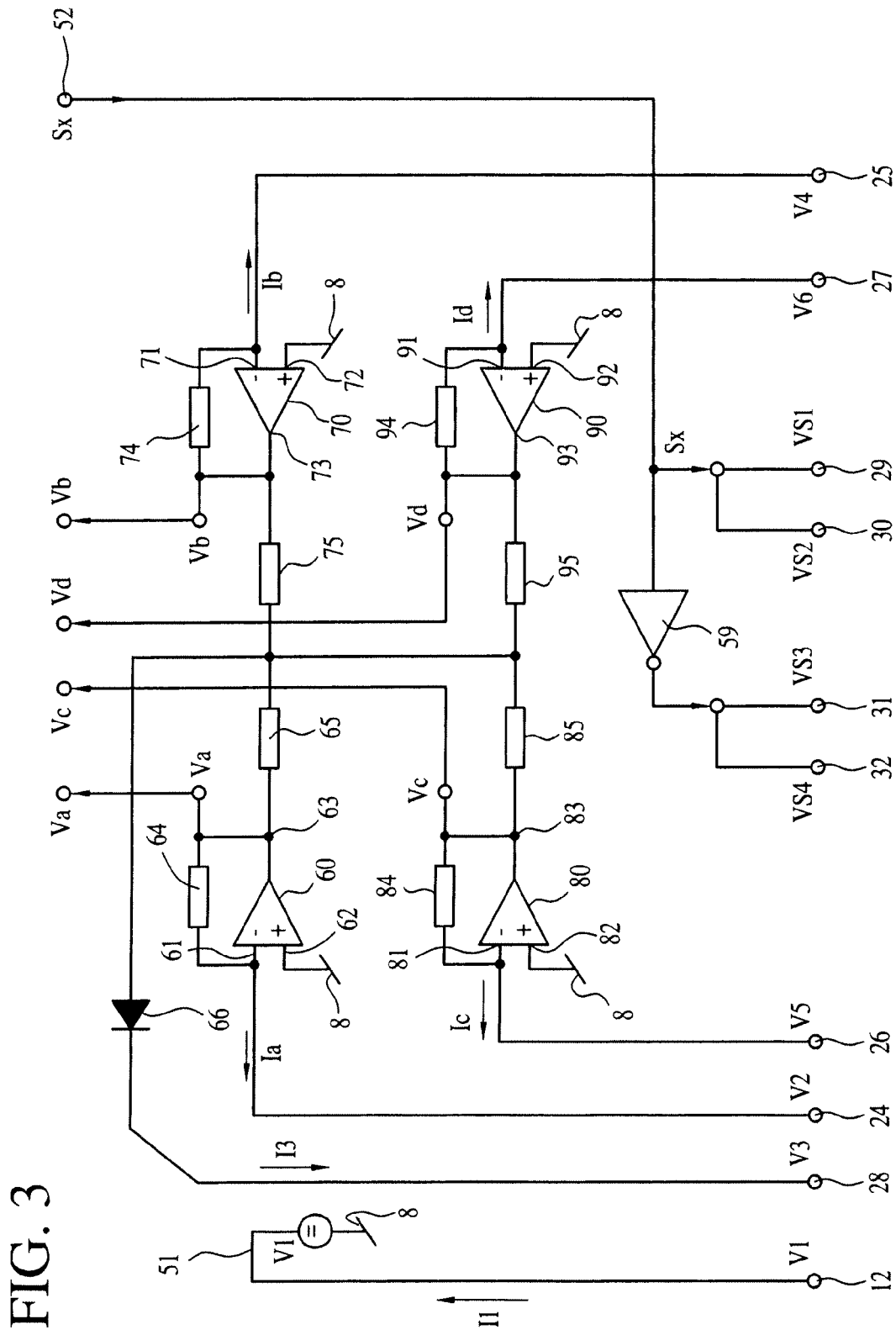
FIG. 3 shows another circuit arrangement embodiment.

FIG. 3 shows a sample embodiment of a circuit arrangement 50 which constitutes a development of the circuit arrangement as shown in FIG. 2A. In addition to the circuit arrangement 50 as shown in FIG. 2A, the circuit arrangement 50 as shown in FIG. 3 has an inverter 59 which is connected at an input to the input 52 of the circuit arrangement 50. The first and the second control terminals 29, 30 are connected to the input of the inverter 59 and the third and fourth control terminals 31, 32 are connected to the output of the inverter 59. Furthermore, the circuit arrangement 50 has third and fourth amplifiers 80, 90 which are connected on the input side to the third and fourth measurement terminals 26, 27, respectively, and third and fourth output signals Vc, Vd, respectively, are provided at their output.

At the input 52 of the circuit arrangement 50, a clock signal Sx is supplied. By means of the inverter 59, the first and second transistors 45, 46 are alternately switched on and blocking with the third and fourth transistors 47, 48.

The y-coordinate can be determined approximately according to the following equation:

$$y = \frac{Dy}{2} \frac{Ic - Id}{Ic + Id} = \frac{Dy}{2} \frac{Vc - Vd}{Vc + Vd},$$

Ic being the third measurement current and Id being the fourth measurement current, Vc being the third output voltage and Vd being the fourth output voltage, and Dy being the distance between the third and the fourth drain regions 26, 27.

In one alternative embodiment, the circuit arrangement has a current division circuit which couples the diode 66 relative to the first, second, third and fourth compensation terminals. The current division circuit can comprise four resistors which are connected at the first terminal to the diode 66 and at the second terminal to a respective one of the four compensation terminals. The resistors can have roughly the same value so that the value of the current which is flowing at the time through each of the four compensation terminals can be roughly the same.

In one embodiment, a photodetector arrangement comprises a semiconductor body with a substrate, a first and a second layer. The first layer is located below the first main surface of the semiconductor body and the second layer is located below the second main surface of the semiconductor body.

The second main surface is opposite the first main surface. The first and second measurement terminals are coupled to the second layer. The first and the second measurement terminals are each located on a peripheral edge of the second layer in regions which are remote from one another. The first transistor is designed for electrical coupling of the second layer to the first measurement terminal. Accordingly, there is a second transistor for electrical coupling of the second layer to the second measurement terminal.

The semiconductor body is suitable for receiving incident light radiation to be detected. The light radiation produces electron hole pairs which contribute to the conductivity in space charge zones. In a first operating state, the first and the second transistors are switched on so that the first and second measurement currents flow through the first layer and the substrate to the second layer and from there, via the first transistor, to the first measurement terminal, and via the second transistor, to the second measurement terminal. In a second operating state, the first and the second transistor are switched off.

In an advantageous manner, the first and the second measurement currents can therefore be turned on and off in the photodetector arrangement.

In one embodiment, third and fourth measurement terminals are coupled to the second layer and are likewise used for making electrical contact to the second layer. The third and fourth measurement terminals are arranged in two other regions near the peripheral edge of the second layer which are remote from one another. An imaginary connecting line between the third and fourth measurement terminals and an imaginary connecting line between the first and the second measurement terminals cross at a angle of roughly 90 degrees. The two connecting lines are preferably formed as straight lines.

A third and a fourth transistor can be used for electrically coupling the second layer to the third and fourth measurement terminals, respectively. In the first operating state, in which the first and the second transistors are in the on state, the third and fourth transistors can block a current path from the second layer to the third and fourth measurement terminals. Conversely, in the second operating state, in which the first and the second transistors are switched off, the third and the fourth transistors are in an on state. Advantageously, by virtue of the four transistors result, it is already selected in the photodetector arrangement whether the position of the incidence site of a light beam is determined between the first and the second measurement terminal or between the third and fourth measurement terminal. In the first operating state, it is therefore possible to determine an x-coordinate, and in the second operating state, a y-coordinate of the position of the incidence site can be determined. The four transistors are thus used as four switching devices integrated in the photodetector arrangement, the controlled paths of the four transistors being encompassed by the semiconductor body.

In one embodiment, the substrate is made as an intrinsic semiconductor. Therefore, a low voltage between the first and the second layer can be sufficient to make available a space charge zone in the substrate.

The first layer can be made as a translucent metal layer, especially a thin gold layer, or as a translucent semiconductor layer, especially as an indium-tin oxide layer. Alternatively, the first layer has the material of the substrate and is made semiconducting. The semiconductor body can comprise a semiconductor material, such as gallium arsenide, indium-gallium arsenide, indium phosphite, germanium, mercury-cadmium telluride. Alternatively, the semiconductor body is made of silicon.

In one embodiment, the first layer has a first type of conduction and the second layer has a second type of conduction which is opposite the first conduction type. The first conduction type can be made as a P-doped or heavily P-doped semiconductor material and the second conduction type as an N-doped or heavily N-doped semiconductor material. Alternatively, the first conduction type can be implemented as an N-doped or heavily N-doped semiconductor material and the second conduction type as a P-doped or heavily P-doped semiconductor material.

In another embodiment, the first and the second layer have the second conduction type. According to this embodiment, a third layer is realized in the semiconductor body between the substrate and the second layer. The third layer has the first conduction type. Advantageously, the portion of the measurement current produced by stray radiation can be derived by means of the third layer.

The first, second, third and fourth transistors can each be made as a bipolar transistor. Advantageously, the four transistors can each by made as a field effect transistor. The four transistors each have a control terminal for making electrical contact.

The four transistors can each have a doping region with the first conduction type that is opposite the conduction type of the second layer. The control terminal of the respective transistor is connected to the doping region. According to the potential at the control terminal, a space charge zone between the doping region and the second layer can be set. The space charge zone can be set such that a current path between the second layer and the respective measurement terminal can be switched on in the first state and interrupted in the second state by means of the potential at the control terminal. The four transistors can therefore in each case be realized as a junction field effect transistor.

In an alternative embodiment, the control terminal is in direct contact to the second layer without interposition of another layer. The control terminal can be realized as a semiconductor, especially in the form of a polysilicon layer, silicide layer or metal layer. The four transistors can thus be implemented as metal semiconductor field effect transistors, abbreviated MESFET.

In further alternative embodiment, a gate insulator layer can be provided between the second layer and the control terminal of one of the four transistors. The gate insulator layer can comprise silicon dioxide. The four transistors can therefore be realized as metal oxide semiconductor field effect transistors, abbreviated MOSFET.

In one embodiment, a measurement arrangement can have the photodetector arrangement and a circuit arrangement. The circuit arrangement is coupled to the total current terminal which is located on the first layer and at which the first potential is provided. The circuit arrangement is coupled to the first and second measurement terminals of the second layer such that at the first and the second measurement terminals, a second and a fourth terminal can be tapped. The circuit arrangement has a control output which is coupled to the first control terminal of the first transistor and the second control terminal of the second transistor. In one development, the circuit arrangement can be coupled at another control output to the third control terminal of the third transistor and the fourth control terminal of the fourth transistor.

In the absence of the third layer in the semiconductor body the first and the second potential can be set such that a PN junction between the first and second layer is reverse-biased. Consequently, the substrate located between the first and second layer is largely free of free charge carriers and photon radiation which has been absorbed in the substrate produces a measurable increase of the charge carrier concentrations and thus obtains the detector current.

If there is a third layer, then a third potential can be applied to the third layer. The first and the third potential are set such that a PN junction between the first and the third layer such that a PN junction between the first and the third junction is reverse-biased. The second and third potential can be set such that a PN junction between the second and third layer is reverse-biased.

In one development, the circuit arrangement has a first current measurement circuit for determining the current flowing through the first measurement terminal. The first current measurement circuit can be implemented as a current/voltage converter which is connected on the input side to the first measurement terminal. In one embodiment, the current/voltage converter comprises a first amplifier which is connected at a first input to the first measurement terminal, at a second input to the reference potential terminal, and at the output via a first feedback impedance to the first input. A first output voltage is provided at the output of the first amplifier. In one development, the circuit arrangement has a second, a third and a fourth current measurement circuit which is connected to the second, third and fourth measurement terminals. In one embodiment, the respective current measurement circuit is made as a current/voltage converter.

The measuring arrangement can be used for determining a position of the impingement location of a light beam impinging on the photodetector arrangement along a coordinate. It may alternatively be useable for determining an x and a y coordinate of the position of the impingement location. The measuring arrangement may be used for ascertaining alignment errors of shafts arranged one behind another. One advantage of the photodetector arrangement is that the second layer, for instance, during the determination of the x coordinate, can be decoupled from the third and the fourth measurement terminal, with the result that the x coordinate can be determined very accurately. This also correspondingly holds true for the determination of the y coordinate.

In one embodiment, a method for operating a measuring arrangement comprising a photodetector arrangement provides the following steps: the photodetector arrangement is irradiated with a light beam. Electron-hole pairs are thereby generated in a semiconductor body of the photodetector arrangement. The free electrons and the free holes are conducted away via a first and a second measurement terminal in a first operating state, by virtue of the fact that a first and a second transistor are switched on. In a second operating state, the free electrons and the free holes are not conducted away via the first and the second measurement terminal since the two transistors are switched off.

In one embodiment, a first and a second measurement current comprise the free electrons and the free holes. The first and the second measurement currents preferably flow from the first and from the second measurement terminal through the first and respectively the second transistor, a second layer of the semiconductor body and a substrate of the semiconductor body to a first layer of the semiconductor body. The first layer is arranged at a first main surface of the semiconductor body and the second layer is arranged at a second main surface of the semiconductor body, which is remote from the first main surface.

In a development, a third and a fourth transistor are provided for coupling the second layer to a third and a fourth measurement terminal. Consequently, an x coordinate or a y coordinate of the incidence location of a light beam can be determined alternately. If the third and the fourth transistor are switched off in the first operating state, then the third and the fourth measurement terminal are not coupled to the second layer, and therefore, do not distort the electrical potential conditions and the current lines between the first and the second measurement terminal, with the result that an accuracy of the position determination is improved.

What is claimed is:

1. A photodetector arrangement having a semiconductor body comprising:
   a substrate,
   a first layer at a first main surface of the semiconductor body, the semiconductor body being adapted for receiving incident photon radiation to be detected,
   a second layer at a second main surface of the semiconductor body, the second main surface being remote from the first main surface,
   first and second measurement terminals which are arranged at the second main surface on edge regions of the second layer that are remote from one another and are formed for external electrical contact-connection of the second layer, and
   first and second transistors for electrically coupling the second layer to the first and the second measurement terminals, respectively,
   wherein an output representing an x-coordinate of a position of incidence site of a light beam is obtained from the level of the first and second measurement currents flowing through the first and second measurement terminals, respectively, in accordance with the relationship:

$$X = \frac{Dx}{2} \frac{Ia - Ib}{Ia + Ib}$$

where x is the x-coordinate of the position of incidence, Dx is the distance between the first and second transistors, Ia is the first measurement current flowing through the first measurement terminal and Ib is the second measurement current flowing through the second measurement terminal.

2. The photodetector arrangement as claimed in claim 1, further comprising:

third and fourth measurement terminals which provide external electrical contact-connection of the second layer from outside the semiconductor body and are arranged at the second main surface on the second layer at two additional edge regions remote from one another in such a way that an imaginary connecting line from the third to the fourth measurement terminal and an imaginary connecting line from the first to the second measurement terminal cross one another, and third and fourth transistors for electrically coupling the second layer to the third and fourth measurement terminals, respectively.

3. The photodetector arrangement as claimed in claim 1, wherein the substrate is formed of an intrinsic semiconductor material.

4. The photodetector arrangement as claimed in claim 1, wherein the second layer is formed in a high-resistance manner.

5. The photodetector arrangement as claimed in claim 4, in which the second layer has a sheet resistance of between 1 and 9 kohm/square.

6. The photodetector arrangement as claimed in claim 1, wherein the first layer has a first conduction type and the second layer has a second conduction type which is opposite the first conduction type.

7. The photodetector arrangement as claimed in claim 1, wherein the first layer has a second conduction type and the second layer has the second conduction type, and wherein a third layer is provided in the semiconductor body, the third layer being arranged between the substrate and the second layer and having a first conduction type which is opposite the second conduction type.

8. The photodetector arrangement as claimed in claim 7, in which the third layer has a higher sheet resistance than the second layer.

9. The photodetector arrangement as claimed in claim 8, in which the second layer has a sheet resistance of between 10 and 100 kohm/square.

10. The photodetector arrangement as claimed in claim 1, wherein one of the transistors is adapted to block a current path from the second layer to a respective one of the measurement terminals in a first operating state and to switch it on in a second operating state.

11. The photodetector arrangement as claimed in claim 1, wherein one of the transistors is formed as a field effect transistor and comprises a control terminal for electrical contact-connection.

12. The photodetector arrangement as claimed in claim 11, wherein one of the transistors comprises a doping region which has the first conduction type and is arranged in the second layer at a boundary with respect to the control terminal.

13. The photodetector arrangement as claimed in claim 11, wherein direct contact between the control terminal and the second layer is provided in one of the transistors.

14. The photodetector arrangement as claimed in claim 11, wherein one of the transistors comprises a gate insulator layer arranged between the second layer and the control terminal.

15. The photodetector arrangement as claimed in claim 1, further comprising a measuring circuit arrangement, measuring circuit arrangement being:
connected to a total current terminal arranged on the first layer for tapping off a first potential,
connected to the first and second measurement terminals for tapping off a second and a fourth potential, and
connected to the first and the second transistors at a control output.

16. The photodetector arrangement as claimed in claim 15, further comprising:
third and fourth measurement terminals which provide external electrical contact-connection of the second layer from outside the semiconductor body and are arranged at the second main surface on the second layer at two additional edge regions remote from one another in such a way that an imaginary connecting line from the third to the fourth measurement terminal and an imaginary connecting line from the first to the second measurement terminal cross one another, and
third and fourth transistors for electrically coupling the second layer to the third and fourth measurement terminals, respectively;
wherein the measurement circuit arrangement
is connected to the third and the fourth measurement terminals for tapping off a fifth and a sixth potential, and
is connected to the third and the fourth transistors at a further control output.

17. A method for operating a measuring arrangement comprising a photodetector arrangement, comprising the steps of:
irradiating a photodetector arrangement with a photon radiation,
generating electron-hole pairs in a semiconductor body of the photodetector arrangement from the photon radiation,
switching on a first and a second transistor which couple a second layer at a second main surface of the semiconductor body to a first and a second measurement terminal, respectively, in a first operating state and determining a first and a second measurement current flowing through the first and second measurement terminals, respectively,
determining an x coordinate of a position of incidence site of a light beam from the level of the first and second measurement currents, and
switching off the first and the second transistors in a second operating state.

18. The method as claimed in claim 17, comprising the further steps of:
switching off a third and a fourth transistor which couple the second layer to a third and a fourth measurement terminal, respectively, in the first operating state, and
switching on the third and the fourth transistors in the second operating state and determining a third and a fourth measurement current; and
determining a y coordinate of a position of incidence site of a light beam from the level of the third and fourth measurement currents.

* * * * *